United States Patent
Shiratsuchi et al.

[11] Patent Number: 6,084,176
[45] Date of Patent: Jul. 4, 2000

[54] PHOTOELECTRIC CONVERSION DEVICE AND SOLAR CELL

[75] Inventors: Kentaro Shiratsuchi; Hiroo Takizawa, both of Kanagawa, Japan

[73] Assignee: Fuji Photo Film Co., Ltd., Minami-Ashigara, Japan

[21] Appl. No.: 09/145,268

[22] Filed: Sep. 2, 1998

[30] Foreign Application Priority Data

Sep. 5, 1997 [JP] Japan ................................ 9-257535
Jun. 17, 1998 [JP] Japan ................................ 10-186935

[51] Int. Cl.[7] .......................... H01L 51/20; H01L 51/30; H01L 31/04; H01G 9/20
[52] U.S. Cl. .......................... 136/263; 136/248; 136/252; 136/255; 136/260; 136/265; 257/40; 257/43; 257/184; 257/431; 429/111
[58] Field of Search ........................ 136/263, 248, 136/255, 252, 260, 265; 257/40, 43, 431, 184; 429/111

[56] References Cited

U.S. PATENT DOCUMENTS

| 5,536,588 | 7/1996 | Naito | 428/690 |
| 5,683,833 | 11/1997 | Haussling et al. | 136/263 |
| 5,885,368 | 3/1999 | Lupo et al. | 136/263 |

FOREIGN PATENT DOCUMENTS

| 0 468528 A1 | 7/1991 | European Pat. Off. . |
| 718858 | 6/1996 | European Pat. Off. . |
| 7-157454 | 6/1995 | Japan . |
| WO97/10617 | 2/1996 | WIPO . |
| WO 97/10617 | 3/1997 | WIPO . |

OTHER PUBLICATIONS

Cao et al., J. Phys. Chem., 99, 17071–17073. (Month Unknown), 1995.
O'Regan et al., J. Appl. Phys., 80(8), 4749–4754, Oct. 1996.
Hagen et al., Synthetic Metals, 89, 215–220, Oct. 1997.
Murakoshi et al., Chemistry Letters, 471–472. (Month Unknown), 1997.
Jürgen Hagen et al, "Novel hybrid solar cells consisting of inorganic nanoparticles and an organic hole transport material", Synthetic Metals, pp. 215–220, Oct. 1997.
Kei Murakoshi et al, "Solid State Dye–Sensitized TiO2 Solar Cell with Polypyrrole as Hole Transport Layer", Chemistry Letters 1997, pp. 471–472.

*Primary Examiner*—Alan Diamond
*Attorney, Agent, or Firm*—Burns, Doane, Swecker & Mathis, LLP

[57] ABSTRACT

A photoelectric conversion device has a layer of dye-sensitized nanoparticulate semiconductor and a hole transporting layer containing an organic hole transporting agent. The dye-sensitized photoelectric conversion device is fully durable. A solar cell comprising the photoelectric conversion device is also provided.

9 Claims, 1 Drawing Sheet

PHOTOELECTRIC CONVERSION DEVICE AND SOLAR CELL

This invention relates to a photoelectric conversion device, and more particularly, to a photoelectric conversion device comprising a dye-sensitized nanoparticulate semiconductor. It also relates to a solar cell.

BACKGROUND OF THE INVENTION

It is of the world-wide concern that as a result of rapid population increase, economical scale-up of developed countries, the industrialization of developing countries, the modernization of livelihood, and the rise of living standards, the consumption of food and energy resources is acceleratively increasing, and more environmental disruption occurs on the global scale. For the sustainable development in harmony with the environment, the widespread use of solar power generation and clean energy is desirable. Active research works have been made in this field.

With respect to the solar power generation, monocrystalline silicon solar batteries, polycrystalline silicon solar batteries, amorphous solar batteries, and compound solar batteries using cadmium telluride or indium copper selenide have been used in practice or become the major object of research and development. For the widespread use, problems including the manufacturing cost, the availability of source materials, and a long energy payback period must be solved. On the other hand, many solar batteries using organic materials intended for increasing the surface area and lowering the cost have also been proposed as disclosed in JP-A 131782/1978, 27387/1979, 35477/1980, 215070/1989, 10576/1992, and 85294/1994. They have the drawbacks of low efficiency conversion and poor durability.

Under the circumstances, Nature, Vol. 353, pp. 737–470, 1991, U.S. Pat. No. 4,927,721, 4,684,537, 5,084,365, 5,350,644, 5,463,057, 5,525,440, JP-A 249790/1995, JP-B 15097/1996 disclose photoelectric conversion devices comprising dye-sensitized nanoparticulate semiconductors (to be referred to as dye-sensitized photoelectric conversion device, hereinafter) as well as materials and processes for use in the manufacture of these converters. The device proposed in these patents is a wet solar battery having as a working electrode a porous titanium dioxide thin film spectrally sensitized with a ruthenium complex. A first advantage of this system is that photoelectric conversion devices are obtained at a relatively low cost since inexpensive oxide semiconductors can be used without a need for work-up to a high purity. A second advantage of this system is that since the dyes used have a broad absorption band, photons in almost all the wavelength band of visible light can be converted into electric current, achieving a high energy conversion efficiency of 10% (AM 1.5). However, since this device is a wet solar battery in which electrical connection with a counter electrode is provided by an electrolyte solution, long-term operation causes the depletion of the electrolyte solution and hence, a substantial drop of photoelectric conversion efficiency so that the device may not exert its own function. As a solution to these drawbacks, International Patent No. 93/20565 proposes a device using a solid electrolyte, JP-A 288142/1995, Solid State Tonics, 89 (1996), 263, and JP-A 27352/1997 propose a photoelectric conversion device using crosslinked polyethylene oxide solid polymer electrolyte for solidification, and J. Phys. Chem., 1995, 99, 1701–1703 proposes a photoelectric conversion device using polyacrylonitrile polymeric gel electrolyte for solidification. However, although the photoelectric conversion devices using these solid electrolytes are apparently solidified, most of them contain an electrolyte solution and thus cannot fundamentally avoid a drop of ion conductivity due to the depletion of the electrolytic solution and hence, a substantial decline of device performance. Therefore, engineers hesitate to say that the "depletion of electrolytic solution with the lapse of time" which is a problem inherent to wet solar batteries has been essentially solved.

SUMMARY OF THE INVENTION

An object of the present invention is to provide a dye-sensitized photoelectric conversion device having improved durability. Another object of the present invention is to provide a solar cell, especially a photo-regenerative solar cell using the same.

According to the invention, there is provided a photoelectric conversion device comprising a nanoparticulate semiconductor sensitized with a dye and a hole transporting layer containing an organic hole transporting agent. Suitable organic hole transporting agents are aromatic tertiary amine compounds.

A solar cell comprising the photoelectric conversion device is also contemplated.

BRIEF DESCRIPTION OF THE DRAWINGS

The only FIGURE.

BEST MODE FOR CARRYING OUT THE INVENTION

Figure 1:
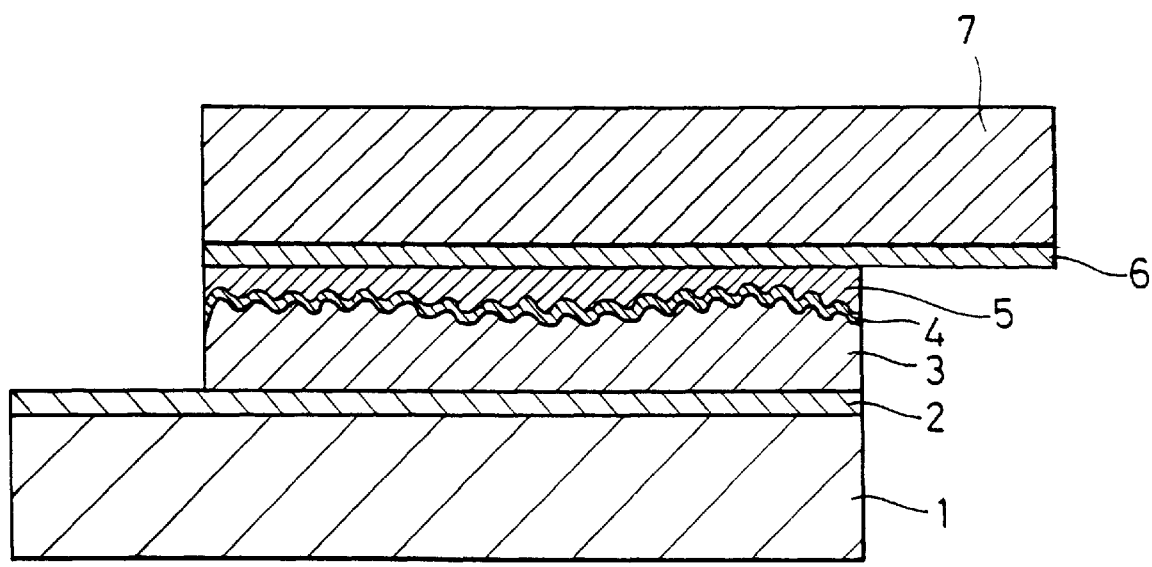
FIG. 1 is a diagrammatic sectional view showing the layer structure of a solar cell constructed in Example.

In one preferred embodiment of the present invention, the dye-sensitized photoelectric conversion device includes a conductive support, a layer (or photosensitive layer) formed on the support by coating a nanoparticulate semiconductor having a dye adsorbed thereon, a hole transporting layer containing an organic hole transporting agent, and a counter electrode.

The conductive supports may be metal supports which themselves are electrically conductive or supports of glass or plastics having a conductive agent layer on their surface. In the latter case, the preferred conductive agents are metals such as platinum, gold, silver, copper, aluminum, rhodium, and indium, carbon, and conductive metal oxides such as indium-tin compound oxide and tin oxide doped with fluorine. Especially preferred is a conductive glass support in the form of a transparent support of soda lime float glass having deposited thereon a conductive layer of fluorine-doped tin dioxide. The conductive agent layer is preferably about 0.05 to 10 μm thick.

It is recommended that the conductive supports have a lower surface resistivity. The preferred range of surface resistivity is up to 100 Ω/cm$^2$, more preferably up to 50 Ω/cm$^2$. The lower limit is not critical although it is usually about 0.1 Ω/cm$^2$.

It is also recommended that the conductive supports be substantially transparent. The term "substantially transparent" means that the light transmittance of the support is at least 10%, preferably at least 50%, more preferably at least 70%. As the transparent conductive support, glass or plastic supports having conductive metal oxide coated thereon are preferable. The coverage or weight of conductive metal oxide coated is preferably 0.1 to 100 g per square meter of the glass or plastic support. Where transparent conductive supports are used, it is desired that light enters the device from the support side.

In the photosensitive layer, nanoparticulates of metal chalcogenides (e.g., oxides, sulfides and selenides) or perovskite may be used as the nanoparticulate semiconductor. Examples of the metal chalcogenides include oxides of titanium, tin, zinc, tungsten, zirconium, hafnium, strontium, indium, cerium, yttrium, lanthanum, vanadium, niobium, and tantalum, cadmium sulfide, and cadmium selenide. Examples of the perovskite are strontium titanate and calcium titanate. Of these, titanium oxide, zinc oxide, tin oxide and tungsten oxide are especially preferred.

The semiconductor nanoparticulates preferably have a mean particle size of 5 to 200 nm, more preferably 8 to 100 nm, expressed by the diameter of a circle of equivalent area to the projected area of a primary particle.

Various methods are employable for coating semiconductor nanoparticulates to a conductive support. Exemplary methods are a method of applying a dispersion liquid or colloid solution of semiconductor nanoparticulates onto a conductive support, and a method of applying a semiconductor nanoparticulate precursor onto a conductive support and allowing the precursor to be hydrolyzed with moisture in air, thereby forming a semiconductor nanoparticulate coating. The dispersion liquid of semiconductor nanoparticulates can be prepared by such methods as grinding in a mortar, milling and dispersing in a mill, and synthesizing a semiconductor under such conditions that the semiconductor may precipitate in a solvent as nanoparticulates. The dispersing media may be water or various organic solvents such as methanol, ethanol, dichloromethane, acetone, acetonitrile, and ethyl acetate. In forming a dispersion, polymers, surfactants, acids or chelate agents may be used as the dispersant if necessary.

Semiconductor nanoparticulates are desired to have a greater surface area so that more dye may be adsorbed thereon. The semiconductor nanoparticulate layer as applied onto the support should preferably have a surface area which is greater than the projected area by a factor of at least 10, more preferably at least 100. No upper limit is imposed on the surface area although the upper limit is usually a multiplication factor of about 5,000.

In general, as the semiconductor nanoparticulate layer becomes thicker, the amount of the dye carried per unit projected area increases so that the capture rate of light becomes higher, but the loss by charge recombination becomes greater because the diffusion distance of generated electrons increases. For this reason, the semiconductor nanoparticulate layer has an appropriate range of thickness which is typically 0.1 to 100 $\mu$m. When the semiconductor nanoparticulate layer is used in a solar cell, an appropriate thickness is 1 to 50 $\mu$m, especially 3 to 30 $\mu$m. After coating on a support, semiconductor nanoparticulates may be fired in order to bring the particulate into electronic contact and improve the strength and the adhesion to the support of the coating. Further, after firing, the semiconductor nanoparticulates may be subject to chemical plating in an aqueous solution of titanium tetrachloride or electrochemical plating in an aqueous solution of titanium trichloride.

The coverage or weight of semiconductor nanoparticulates coated is preferably 0.5 to 500 g, more preferably 5 to 100 g per square meter of the support. The dyes, also called chromophores or sensitizers, which are used in the present invention are preferably ruthenium complex dyes and/or polymethine dyes.

Where ruthenium complex dyes are used in the practice of the invention, they are preferably of the following general formula (1).

$$(X)_n RuLL_1 \qquad (1)$$

In formula (1), Ru is ruthenium, X is a ligand selected from the group consisting of CL, SCN, H$_2$O, Br, I, CN, —NCO, and SeCN, letter n is equal to 1 or 2, preferably equal to 2, L and L$_1$ each are an organic ligand selected from the following ligands L-1 to L-8.

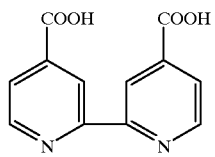

L-1

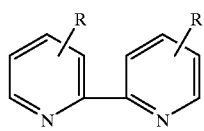

L-2

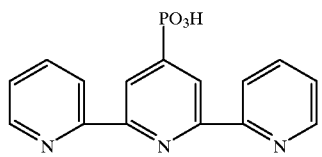

L-3

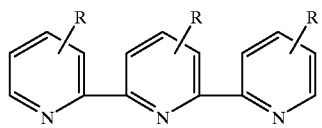

L-4

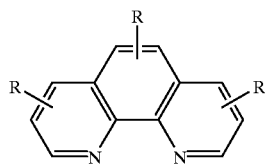

L-5

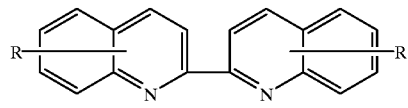

L-6

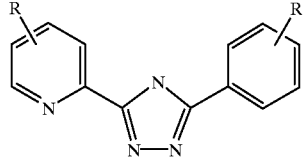

L-7

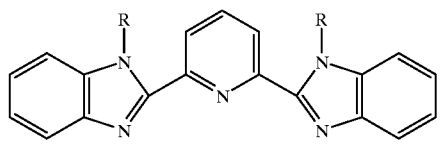

L-8

In the formulae, R is hydrogen, a halogen atom or a substituted or unsubstituted alkyl, aralkyl or aryl group having 1 to 12 carbon atoms.

The ruthenium complex dyes which can be used herein are, for example, the complex dyes described in U.S. Pat. Nos. 4,927,721, 4,684,537, 5,084,365, 5,350,644, 5,463,057, 5,525,440 and JP-A 249790/1995.

Preferred illustrative, non-limiting, examples of the ruthenium complex dyes which can be used herein are given below.

TABLE 1

| No. | X | n | L | $L_1$ |
|---|---|---|---|---|
| R-1 | SCN | 2 | L-1 | L-1 |
| R-2 | CN | 2 | L-1 | L-1 |
| R-3 | Cl | 2 | L-1 | L-1 |
| R-4 | Br | 2 | L-1 | L-1 |
| R-5 | I | 2 | L-1 | L-1 |
| R-6 | SCN | 2 | L-1 | L-2 |
| R-7 | SCN | 1 | L-1 | L-3 |
| R-8 | Cl | 1 | L-1 | L-4 |
| R-9 | I | 2 | L-1 | L-5 |
| R-10 | SCN | 2 | L-1 | L-6 |
| R-11 | CN | 2 | L-1 | L-7 |
| R-12 | Cl | 1 | L-1 | L-8 |

Where polymethine dyes are used in the practice of the invention, they are preferably of the following general formula (2) or (3).

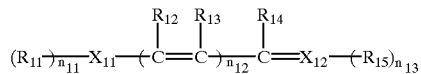

In formula (2), $R_{11}$ and $R_{15}$ are hydrogen, alkyl groups, aryl groups or heterocyclic residues, $R_{12}$ to $R_{14}$ are hydrogen or substituents. Alternatively, $R_{11}$ to $R_{15}$, taken together, may form a ring. $X_{11}$ and $X_{12}$ are nitrogen, oxygen, sulfur, selenium or tellurium. Letters $n_{11}$ and $n_{13}$ are integers of C to 2, and $n_{12}$ is an integer of 1 to 6. The compound of formula (2) may have a counter ion if necessary from the overall electric charge of its molecule.

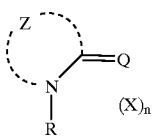

In formula (3), Z is a group of non-metallic atoms necessary to form a nitrogenous heterocycle. R is an alkyl or aryl group. Q is a methine or polymethine group necessary for the compound of formula (3) to become a methine dye. It is noted that Z, R and Q represent groups which enable the compound of formula (3) to have at least one substituent of the general formula (4). X is a charge equilibrating counter ion. Letter n is a number of 0 to 10 necessary to neutralize the electric charge of the molecule.

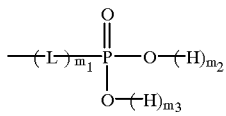

In formula (4), L is an oxygen atom, sulfur atom or amino group, letter $m_1$ is equal to 0 or 1, $m_2$ and $m_3$ are equal to 0 or 1. Nowhere $m_2$ or $m_3$ is 0, the substituent of formula (4) has a negative charge.

Illustrative examples of the polymethine dye are described in M. Okawara, T. Kitao, T. Hirasima & M. Matuoka, "Organic Colorants" (Elsevier). For efficiency solar light energy conversion, it is preferred that dyestuffs have appropriate interlocking groups to surfaces of semiconductor nanoparticulates. The interlocking groups have the function of facilitating electron transfer between the excited state of the dyestuff and the conduction band of semiconductor nanoparticulates. Suitable interlocking groups are carboxylate groups, cyano groups, phosphate groups, and chelating groups having π-conducting character such as oximes, dioximes, hydroxy quinolines, salicylates and alpha-keto enolates.

Preferred, illustrative, non-limiting examples of the polymethine dyes of general formulae (2) and (3) are given below.

Examples of the dye of formula (2)

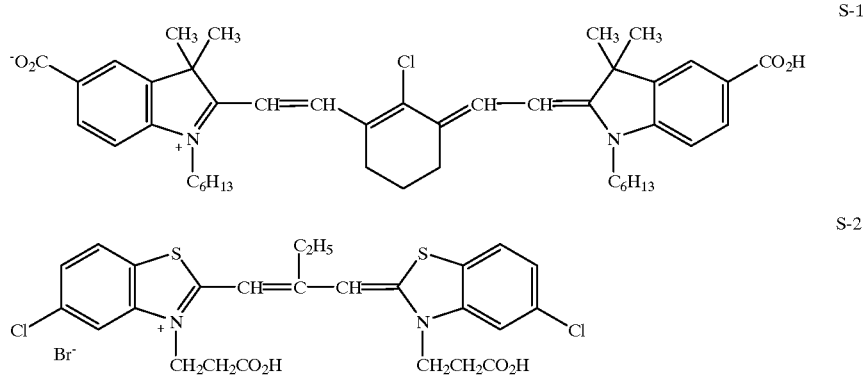

-continued
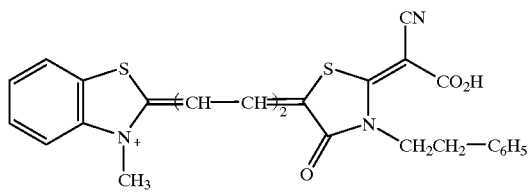
S-3
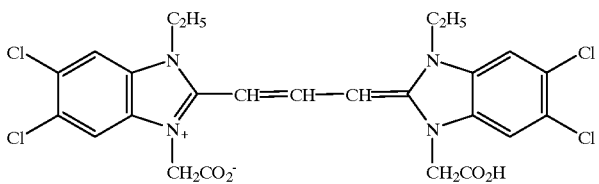
S-4
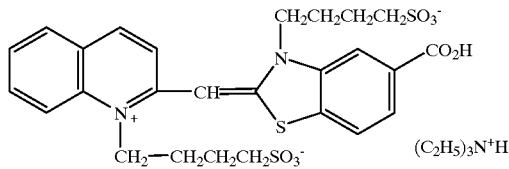
S-5
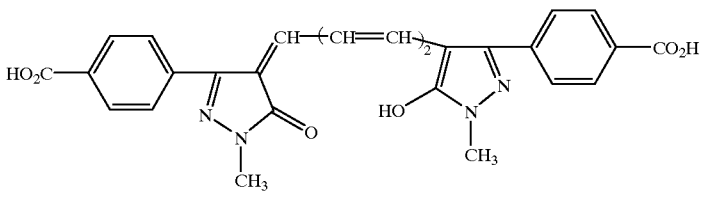
S-6
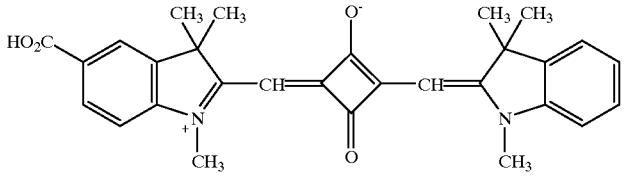
S-7
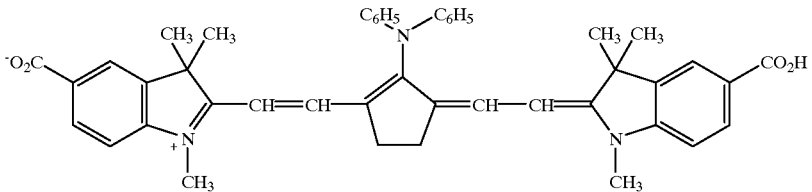
S-8
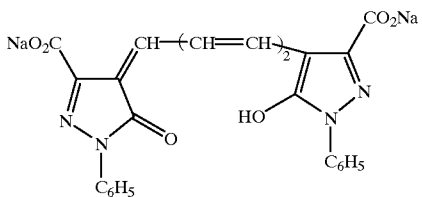
S-9
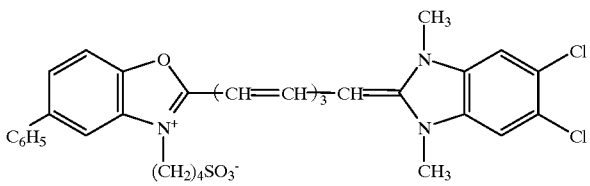
S-10

Examples of the dye of formula (3)

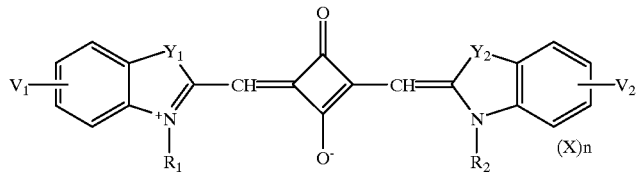

| Compound | $Y_1$ | $Y_2$ | $V_1$ | $V_2$ | $R_1$ | $R_2$ | X | n |
|---|---|---|---|---|---|---|---|---|
| S-11 | S | S | 5-PO(OH)$_2$ | 5-PO(OH)$_2$ | C$_2$H$_5$ | C$_2$H$_5$ | — | — |
| S-12 | S | S | 6-PO(OH)$_2$ | 6-PO(OH)$_2$ | C$_2$H$_5$ | C$_2$H$_5$ | — | — |
| S-13 | S | S | 5-PO(CH)$_2$ | 5-PO(OH)$_2$ | —CH$_2$COOH | —CH$_2$COOH | — | — |
| S-14 | S | S | 5-PO(OH)$_2$ | 5-PO(OH)$_2$ | —(CH$_2$)$_3$SO$_3^-$ | —(CH$_2$)$_3$SO$_3^-$ | Na$^+$ | 2 |
| S-15 | O | O | 6-PO(OH)$_2$ | 6-PO(OH)$_2$ | CH$_3$ | CH$_3$ | — | — |
| S-16 | C(Me)$_2$ | C(Me)$_2$ | 6-PO(OH)$_2$ | 6-PO(OH)$_2$ | C$_2$H$_5$ | C$_2$H$_5$ | — | — |

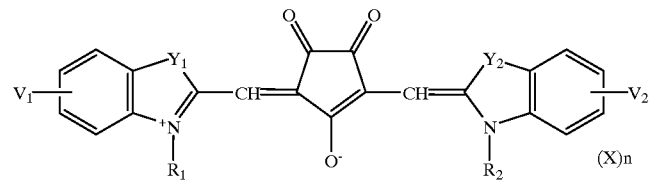

| Compound | $Y_1$ | $Y_2$ | $V_1$ | $V_2$ | $R_1$ | $R_2$ | X | n |
|---|---|---|---|---|---|---|---|---|
| S-17 | S | S | 5-PO(OH)$_2$ | 5-PO(OH)$_2$ | C$_2$H$_5$ | C$_2$H$_5$ | — | — |
| S-18 | C(Me)$_2$ | C(Me)$_2$ | 6-PO(OH)$_2$ | 6-PO(OH)$_2$ | C$_2$H$_5$ | C$_2$H$_5$ | — | — |

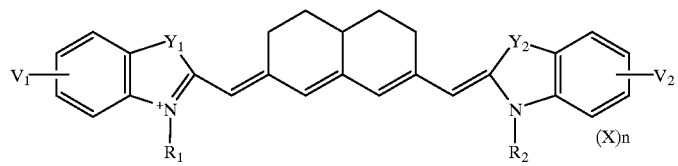

| Compound | $Y_1$ | $Y_2$ | $V_1$ | $V_2$ | $R_1$ | $R_2$ | X | n |
|---|---|---|---|---|---|---|---|---|
| S-19 | S | S | 5-PO(OH)$_2$ | 5-PO(OH)$_2$ | CH$_3$ | CH$_3$ | I$^-$ | 1 |
| S-20 | S | S | 5-PO—O—<br>\|<br>OH | 5-PO(OH)$_2$ | C$_2$H$_5$ | C$_2$H$_5$ | — | — |

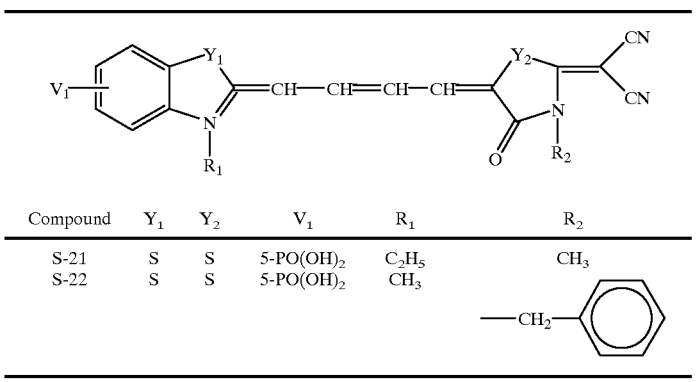

| Compound | $Y_1$ | $Y_2$ | $V_1$ | $R_1$ | $R_2$ |
|---|---|---|---|---|---|
| S-21 | S | S | 5-PO(OH)$_2$ | C$_2$H$_5$ | CH$_3$ |
| S-22 | S | S | 5-PO(OH)$_2$ | CH$_3$ | —CH$_2$—C$_6$H$_5$ |

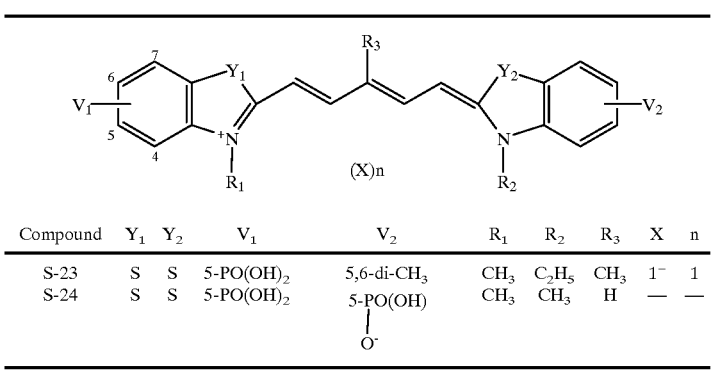

| Compound | $Y_1$ | $Y_2$ | $V_1$ | $V_2$ | $R_1$ | $R_2$ | $R_3$ | X | n |
|---|---|---|---|---|---|---|---|---|---|
| S-23 | S | S | 5-PO(OH)$_2$ | 5,6-di-CH$_3$ | CH$_3$ | C$_2$H$_5$ | CH$_3$ | I$^-$ | 1 |
| S-24 | S | S | 5-PO(OH)$_2$ | 5-PO(OH)O$^-$ | CH$_3$ | CH$_3$ | H | — | — |

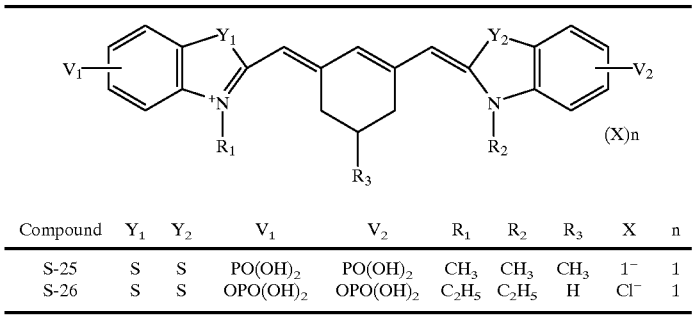

| Compound | $Y_1$ | $Y_2$ | $V_1$ | $V_2$ | $R_1$ | $R_2$ | $R_3$ | X | n |
|---|---|---|---|---|---|---|---|---|---|
| S-25 | S | S | PO(OH)$_2$ | PO(OH)$_2$ | CH$_3$ | CH$_3$ | CH$_3$ | I$^-$ | 1 |
| S-26 | S | S | OPO(OH)$_2$ | OPO(OH)$_2$ | C$_2$H$_5$ | C$_2$H$_5$ | H | Cl$^-$ | 1 |

The compounds of general formulae (2) and (3) can be synthesized by the methods described in F. M. Harmer, Heterocyclic Compounds—Cyanine Dyes and Related Compounds, John Wiley & Sons, New York, London, 1964; D. M. Sturmer, Heterocyclic Compounds—Special topics in heterocyclic chemistry," Chap. 18, Sec. 14, pp. 482–515, John Wiley & Sons, New York, London, 1977; Rodd's Chemistry of Carbon Compounds, 2nd Ed., vol. IV, part B, 1977, Chap. 15, pp. 369–422, Elsevier Science Publishing Company Inc., New York; and British Patent No. 1,077,611.

The dye is adsorbed to semiconductor nanoparticulates, most often by immersing fully dry semiconductor nanoparticulates in a dye solution for a long period of time. The dye adsorption may be done at room temperature or by heating, for example, under reflux as described in JP-A 249790/1995. The dye adsorption may be done either prior to or subsequent to the coating of semiconductor nanoparticulates. It is also acceptable that semiconductor nanoparticulates and the dye are simultaneously coated whereupon adsorption takes place. It is desirable to remove the unadsorbed dye by washing. Where the coated film is fired, it is preferred that the dye adsorption be done subsequent to firing. It is especially preferred that the dye is quickly adsorbed to the coated film after firing and before water adsorbs to the surface of the coated film. For adsorption, a single dye or a mixture of dyes may be used. For the application to solar cells, dyes are selected and mixed so as to make the wavelength range of photoelectric conversion as broad as possible.

Also for the purpose of reducing the association or interaction between dyes, a colorless compound may be co-adsorbed. Hydrophobic compounds to be co-adsorbed are steroid compounds having a carboxyl group, e.g., cholic acid.

After the adsorption of the dye, the semiconductor nanoparticulates may be surface treated with amines. Preferred amines are pyridine, 4-tert-butylpyridine and polyvinylpyridine. The amines may be used as such if they are liquid or as solutions in organic solvents.

Next, the organic hole transporting agent is described in detail. The organic hole transporting agents which can be used herein include aromatic amine compounds, other low molecular weight hole transporting agents, and hole transporting polymers, which are described below.

(1) Aromatic Amine Compounds

The aromatic amine compounds which can be used as the organic hole transporting agent according to the invention include aromatic diamine compounds having connected tertiary aromatic amine units of 1,1-bis{4-(di-p-tolylamino)phenyl}-cyclohexane as described in JP-A 194393/1984, aromatic amines containing two or more tertiary amines and having two or more fused aromatic rings substituted on the nitrogen atom as typified by 4,4-bis[(N-1-naphthyl)-N-phenylamino]-biphenyl as described in JP-A 234681/1993, aromatic triamines having a start burst structure derived from triphenylbenzene as described in U.S. Pat. No. 4,923,774, aromatic diamines such as N,N'-diphenyl-N,N'-bis(3-methylphenyl)-(1,1'-biphenyl)-4,4'-diamine as described in U.S. Pat. No. 4,764,625, α,α,α',α'-tetramethyl-α,α'-bis(4-di-p-tolylaminophenyl)-p-xylene as described in JP-A 269084/1991, criphenylamine derivatives whose molecule is sterically asymmetric as a whole as described in JP-A 129271/1992, compounds having a plurality of aromatic diamino groups substituted on a pyrenyl group as described in JP-A 175395/1992, aromatic diamines having aromatic tertiary amine units connected through an ethylene group as described in JP-A 264189/1992, aromatic diamines having a styryl structure as described in JP-A 290851/1992, star burst type aromatic triamines as described in JP-A 308688/1992, benzylphenyl compounds as described in JP-A 364153/1992, compounds having tertiary amine units connected through a fluorene group as described in JP-A 25473/1993, triamine compounds as described in JP-A 239455/1993, bisdipyridylaminobiphenyl compounds as described in JP-A 320634/1993, N,N,N-triphenylamlne derivatives as described in JP-A 1972/1994, aromatic diamines having a phenoxazine structure as described in JP-A 290728/1993, diaminophenylphenanthridine derivatives as described in JP-A 45669/1994, and other carbazole derivatives.

(2) Other Hole Transporting Compounds

The low molecular weight compounds other than the aromatic amine compounds which can be used as the organic hole transporting agent according to the invention include hydrazone compounds (JP-A 311591/1990), silazane compounds (U.S. Pat. No. 4,950,950), silanamine derivatives (JP-A 49079/1994), phosphamine derivatives (JP-A 25659/1994), cuinacridone compounds, stilbene compounds such as 4-di-p-tolylamino-stilbene and 4-(di-p-tolylamino)-4'-[4-di-p-tolylamino)-styryl]stilbene, triazole derivatives, oxadiazole derivatives, imidazole derivatives, polyarylalkane derivatives, pyrazoline derivatives, pyrazolone derivatives, amino-substituted chalcone derivatives, oxazole derivatives, styrylanthracene derivatives, fluorenone derivatives, and polysilane derivatives. These compounds may be used alone or in admixture of two or more.

(3) Hole Transporting Polymers

In addition to the aforementioned compounds, polymers can be used as the hole transporting agent. Useful polymers include polyvinyl carbazole and polysilanes (Appl. Phys. Lett., vol. 59, 2760, 1991), polyphosphazenes (JP-A 310949/1993), polyamides (JP-A 10949/1993), polyvinyl triphenylamine (Japanese Patent Application No. 133065/1993), polymers having a triphenylamine skeleton (JP-A 133065/1992), polymers having triphenylamine units connected through a methylene group (Synthetic Metals, vol. 55–57, 4163, 1993), and polymethacrylates containing aromatic amine (J. Polym. Sci., Polym. Chem. Ed., vol. 21, 969, 1983). When polymers are used as the hole transporting agent, they preferably have a number average molecular weight of at least 1,000, more preferably at least 5,000.

Preferred illustrative, non-limiting, examples of the organic hole transporting compound are given below.

H-1

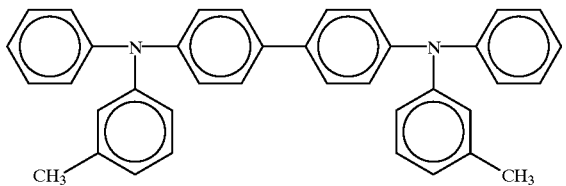

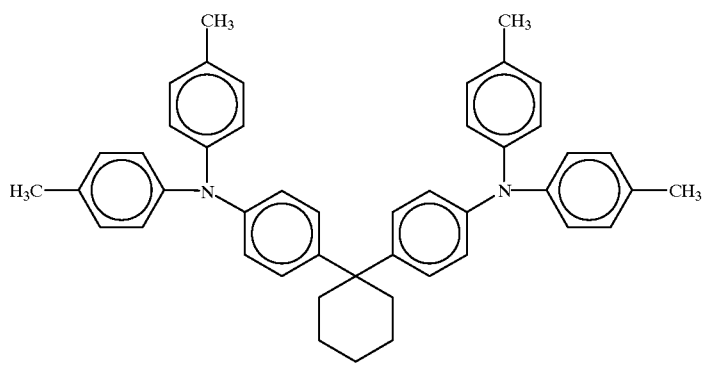
H-2
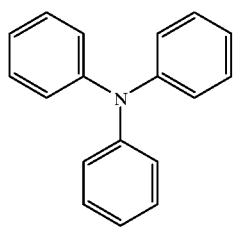
H-3
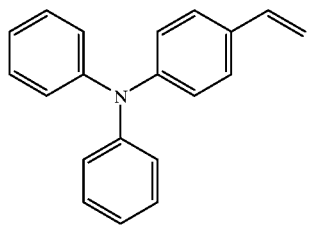
H-4
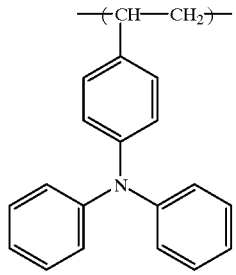
H-5
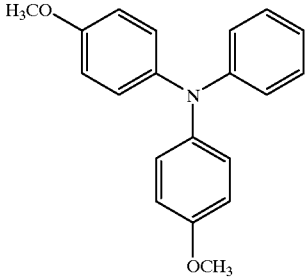
H-6

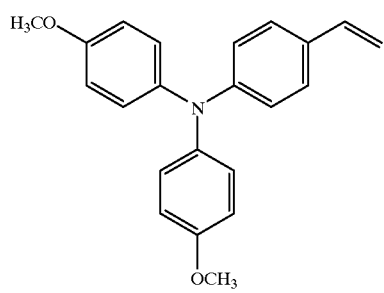
H-7
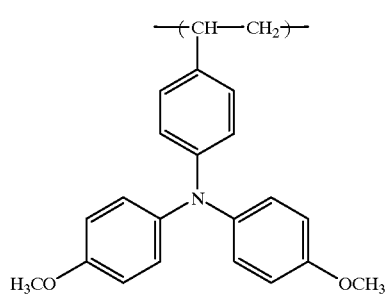
H-8
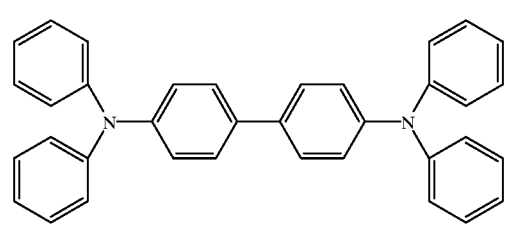
H-9
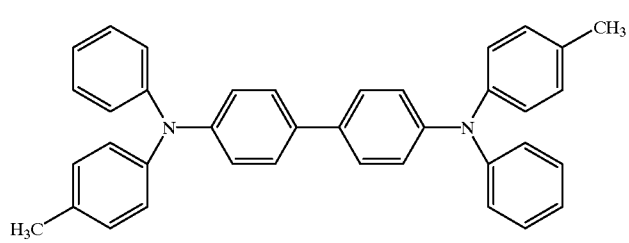
H-10
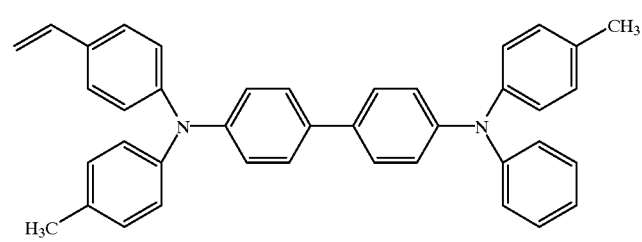
H-11
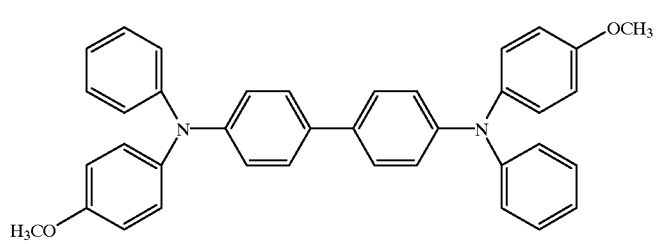
H-12

-continued
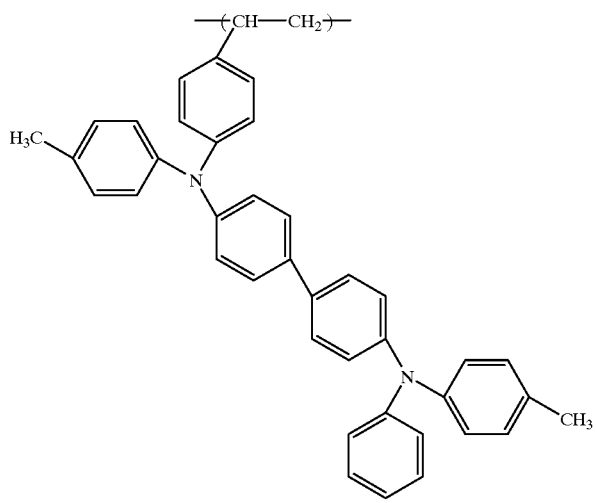
H-13
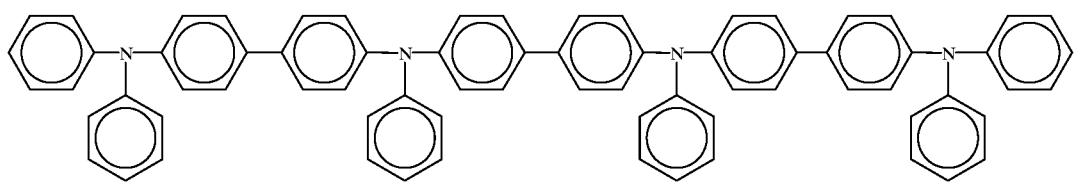
H-14
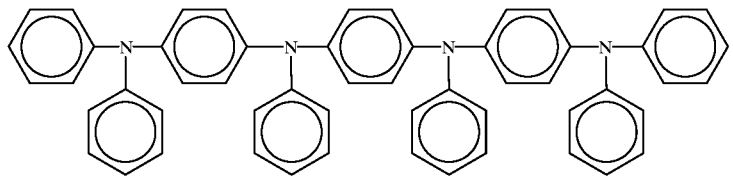
H-15
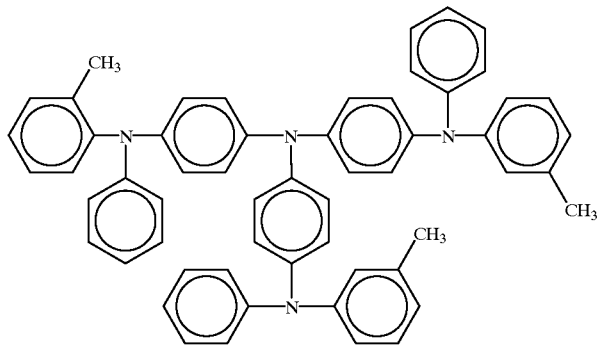
H-16
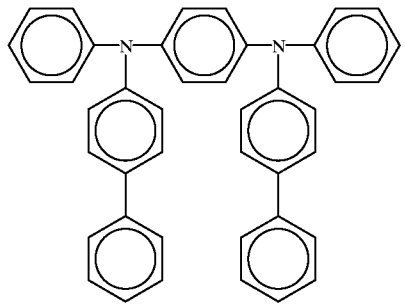
H-17

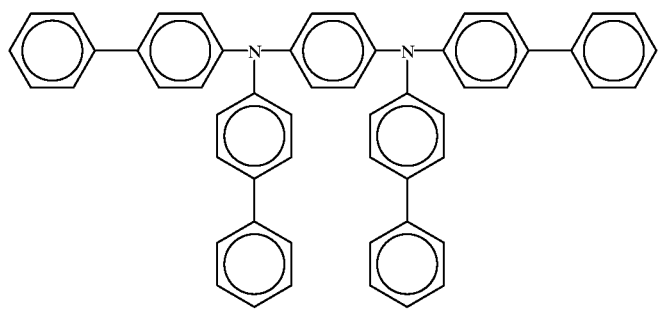
H-18
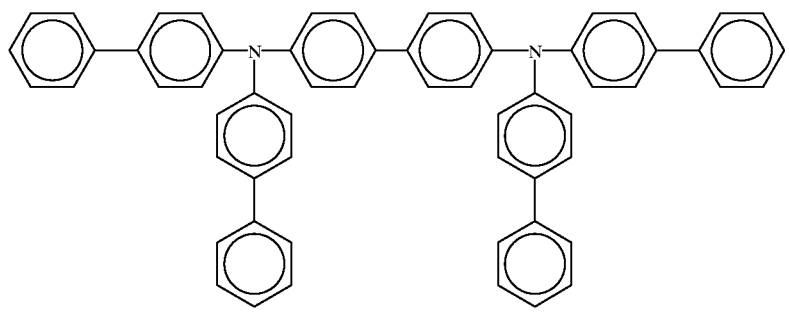
H-19
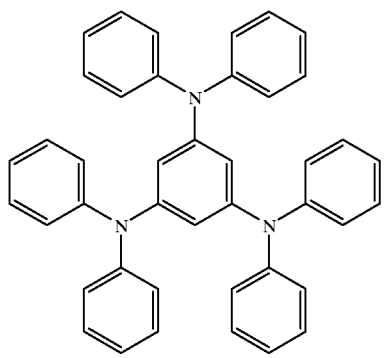
H-20
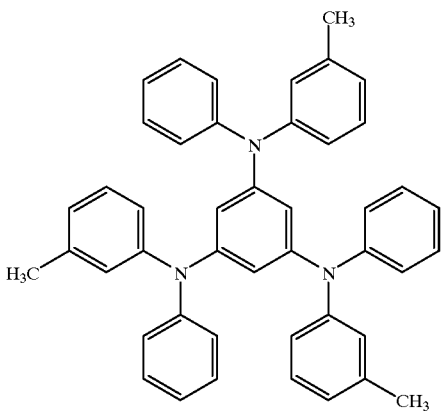
H-21

-continued
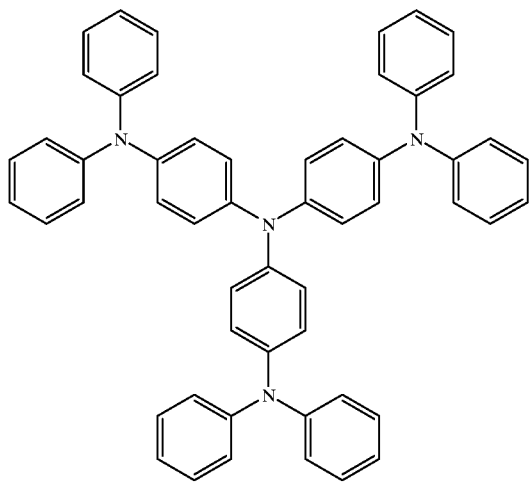
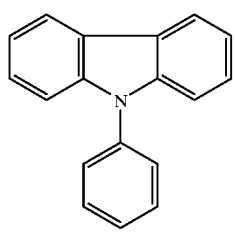
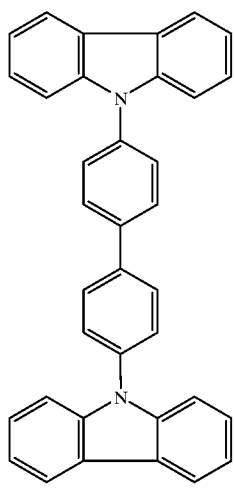
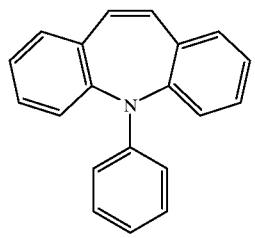
H-22
H-23
H-24
H-25

-continued
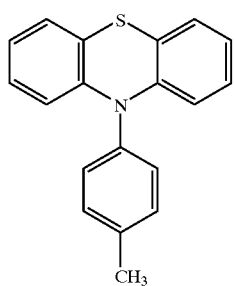
H-26
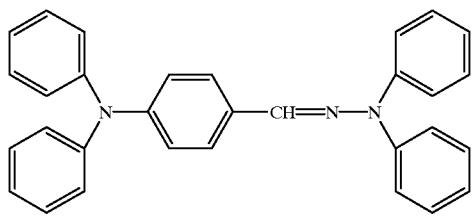
H-27
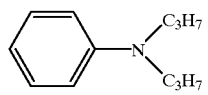
H-28
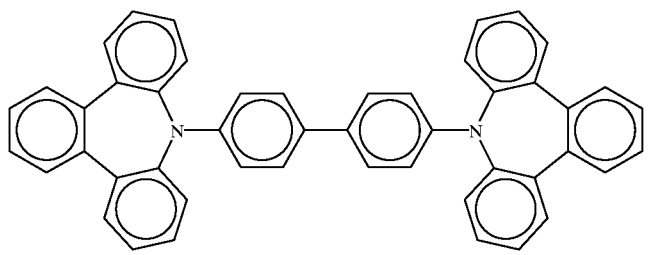
H-29
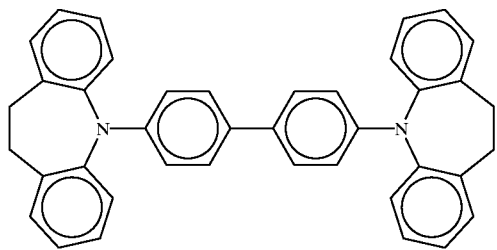
H-30
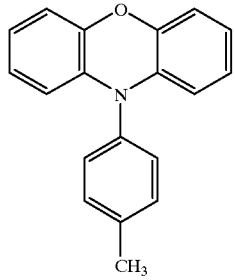
H-31

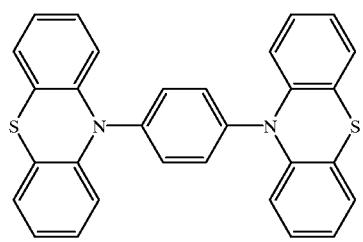
H-32
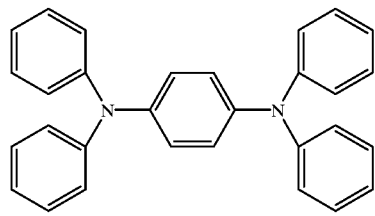
H-33
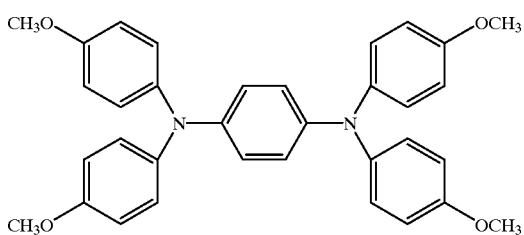
H-34
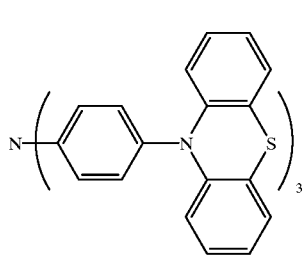
H-35
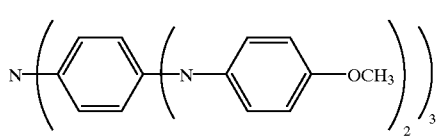
H-36
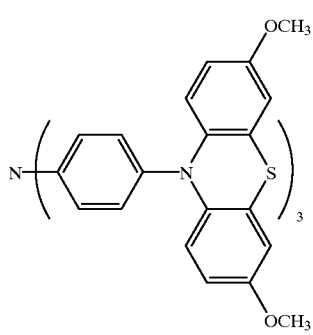
H-37

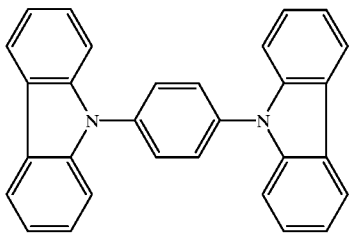

H-38

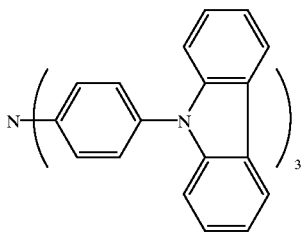

H-39

The majority of the above-described compounds can be synthesized by Ullmann condensation reaction between an iodinated aromatic compound and an aromatic amine compound according to the teachings of Jean Piccard, Herr. Chim. Acta., 7, 789 (1924) and Jean Picard, J. Am. Chem. Soc., 48, 2878 (1926). Where the organic hole transporting compounds are high molecular weight ones, synthesis can be made by radical polymerization in accordance with conventional polymer synthesis processes such as solution polymerization, suspension polymerization, emulsion polymerization, dispersion polymerization and precipitation polymerization. The general description of radical polymerization is found in Ohtsu & Kinosita, Experiment Processes for Polymer Synthesis, Kagaku Dojin Publishing K.K., and Ohtsu, The Theory of Polymerization Reaction 1—Radical Polymerization (1)—, Kagaku Dojin Publishing K.K.

The organic hole transporting layer according to the invention can be formed by a suitable process such as vacuum evaporation, casting, coating, spin coating or dipping.

When the organic hole transporting layer is formed by vacuum evaporation, evaporation is made on an inorganic oxide electrode substrate having a sensitizing dye carried thereon under a properly selected set of conditions including a boat heating temperature of 50 to 400° C., a vacuum of $10^{-6}$ to $10^{-3}$ Pa, a deposition rate of 0.01 to 50 nm/sec., a substrate temperature of −50° C. to +300° C., and a film thickness of 5 nm to 20 $\mu$m.

When the organic hole transporting layer is formed by coating, a coating solution is prepared by dissolving one or more organic hole transporting compounds and optionally, a binder resin capable of transporting holes or substantially incapable of trapping holes and additives such as a coating modifier (e.g., a leveling agent). The coating solution is applied by suitable techniques, and dried to form the organic hole transporting layer. The application techniques include spin coating, dip coating, air knife coating, curtain coating, roller coating, wire bar coating, gravure coating, extrusion coating using the hopper described in U.S. Pat. No. 2,681,294, and multi-layer co-coating as described in U.S. Pat. No. 2,761,418, 3,508,947 and 2,761,791. Examples of the binder resin used herein include aromatic tertiary amine-containing polymers, polysilanes, polycarbonates, polyarylates, and polyesters. Since too large amounts of the binder resin often lead to a reduced hole mobility, the amount of the binder resin is preferably up to 70% by weight, more preferably up to 50% by weight.

The counter electrode serves as a positive electrode in a solar cell. The counter electrode is usually of the same definition as the conductive support described above. In the case of a strength-sustainable construction, the support is not always necessary. The provision of the support is advantageous from the sealing aspect.

In order that light reach the photosensitive layer, at least one of the conductive support and the counter electrode must be substantially transparent. The solar cell of the invention favors the construction that the conductive support is transparent and sunlight is incident on the support side. Better results are obtained in this embodiment when the counter electrode has light reflecting property.

The counter electrode in the solar cell may be a glass or plastic member having a metal or conductive oxide evaporated thereon. Alternatively, a metal thin film may be formed by evaporation or sputtering to a thickness of up to 1 $\mu$m, preferably 10 to 200 nm. In one preferred embodiment, a glass member having platinum evaporated thereon or a meta thin film formed by evaporation or sputtering is used as the counter electrode.

The photosensitive layer is designed in accordance with the intended application and may have a single layer construction or a multilayer construction. The dye in one photosensitive layer may be a single dye or a mixture of dyes.

In the solar cell, especially regenerative solar cell of the invention, the side of the cell may be sealed with a polymer or adhesive for preventing oxidative degradation of the components.

EXAMPLE

Examples are given below for illustrating the preparation of a dye-sensitized photoelectric conversion device and a solar cell according to the invention, but the invention is not limited to these examples.

Examples 1–35

Preparation of Titanium Dioxide Dispersion

A stainless steel vessel having an internal volume of 200 ml and lined on the inside surface with Teflon was charged with 15 grams of titanium dioxide (Degussa P-25 by Nippon Aerosil K.K.), 45 grams of water, 1 gram of a dispersant (Triton X-100 by Aldrich), and 30 grams of zirconia beads having a diameter of 0.5 mm (Nikkato K.K.). Using a sand grinder mill (Imex K.K.), the contents were dispersed at 1,500 rpm for 2 hours. The zirconia beads were removed from the dispersion by filtration.

Preparation of Dye-adsorbed TiO, Electrode

On the conductive surface side of a conductive glass piece coated with fluorine-doped tin oxide (TCO glass by Asahi Glass K.K. cut to 20 mm×20 mm), the dispersion prepared above was applied using a glass bar. More particularly, eight glass pieces were closely arranged two columns (2×4) with the conductive surface side faced upward. Adhesive tape strips were attached to opposite end portions (3 mm from the end) of the two columns of glass pieces. The dispersion was applied to the set of eight glass pieces between the tape strips and spread thereon by sliding a glass bar on the parallel tape strips which serve as a spacer and mask. After application, the coating was air dried for one day at room temperature and the adhesive tape strips were peeled off. The end portions where the adhesive tape strips had been attached were later used to provide electrical connection with a tester for the measurement of photocurrent. Next, the glass pieces were placed in an electric furnace (muffle furnace Model FP-32 by Yamato Science K.K.) where they were fired at 450° C. for 30 minutes. The glass pieces were taken out and cooled down whereupon they were immersed for 3 hours in an ethanol solution containing $3 \times 10^{-4}$ mol/l of an inventive dye as shown in Table 2. The dye-adsorbed glass pieces were immersed in 4-tert-butylpyridine for 15 minutes, washed with ethanol and air dried.

Synthesis of Organic Hole Transportina Agent (H-6)

A 1000-ml three-necked glass flask equipped with a stirrer, thermometer and reflux condenser was charged with 125 grams of tetralin, 6.52 grams of aniline, 49.15 grams of 4-iodoanisole, 77.4 grams of potassium carbonate, and 66.66 grams of copper (I) iodide. The contents were stirred, then heated to 200° C. in a nitrogen stream, and kept at the temperature for 30 hours while stirring, for reaction to take place.

Thereafter, the reaction solution was cooled to room temperature and filtered through Celite. The filtrate was worked up by silica gel chromatography (mobile phase: hexane/ethyl acetate), collecting 10.6 g (yield ~50%) of the end compound H-6 as yellow crystals.

Synthesis of Organic Hole Transporting Agent (H-33)

In 50 ml of o-dichlorobenzene were dissolved 10.4 grams (40 mmol) of N,N'-diphenylaniline, 24.5 grams (0.12 mol) of iodobenzene, 25.2 grams (0.18 mol) of potassium carbonate, 0.50 gram (8 mmol) of copper, and 0.02 gram (0.08 mmol) of iodine. Reaction was carried out at 180° C. for 5 hours in a nitrogen stream. The o-dichlorobenzene and iodobenzene were distilled off in vacuum. The residue was dissolved in chloroform, the inorganic salts were removed by filtration, and the filtrate was concentrated. This was worked up through a column packed with silica gel and $CH_2Cl_2$:hexane-1:1. Recrystallization from acetonitrile gave 13.0 grams (yield 78%) of the end compound H-33.

Synthesis of Organic Hole Transporting Agent (H-35)

In 40 ml of acetic acid were dissolved 12.3 grams (50 mmol) of triphenylamine, 27.4 grams (0.165 mol) of potassium iodide and 35.3 grams (0.165 mol). The solution was stirred at 85° C. for 5 hours in a nitrogen stream. Water and methylene chloride were added to the solution, which was separated, washed twice with an aqueous solution of sodium sulfite and further with an aqueous solution of potassium carbonate. This was dried over magnesium sulfate, concentrated, and dispersed in methanol. Filtration have 15.0 grams (yield 48.2%) of tris(4-iodophenyl)amine.

In 20 mol of o-dichlorobenzene were dissolved 3.11 grams (5 mmol) of tris(4-iodophenyl)amine, 3.0 grams (15 mmol) of phenothiazine, 3.15 grams (22.5 mmol) of potassium carbonate, 0.10 gram (1.5 mmol) of copper, and 0.004 gram (0.015 mmol) of iodine. The solution was stirred at 180° C. for 10 hours in a nitrogen atmosphere. The o-dichlorobenzene was distilled off in vacuum. The residue was cooled and dissolved in chloroform, the inorganic salts were removed by filtration, and the filtrate was concentrated. This was worked up through a column packed with silica gel and $CH_2Cl_2$:hexane=1:3→1:1. Recrystallization from acetonitrile gave 3.37 grams (yield 80.4%) of the end compound H-35.

Organic hole transporting agents other than H-6, H-33 and H-35 could be prepared by the same procedures as above.

Formation of Hole Transporting Layer (Process A)

The dye-sensitized $TiO_2$ electrode substrate (20 mm×20) was secured by a holder in a vacuum deposition apparatus (by Nippon Vacuum Technology K.K.). In a resistance heating boat of molybdenum, 600 mg of an organic hole transporting agent shown in Table 2 was placed. After the vacuum chamber was evacuated to a vacuum of $1 \times 10^{-4}$ Pa, the boat with the organic hole transporting agent was heated whereby MTDATA was deposited on the ITO electrode at a rate of 0.1 to 0.3 nm/sec., forming a hole transporting layer having a thickness of 100 nm.

Formation of Hole Transporting Layer (Process B)

Using a wire bar, a solution containing an organic hole transporting agent and 20% by weight of a binder in methylene chloride as shown in Table 2 was applied onto the dye-sensitized $TiO_2$ electrode substrate (20 mm×20 mm). By vacuum drying at room temperature for 24 hours, a hole transporting layer was formed.

Formation of Counter Electrode

The dye-sensitized electrode having the hole transporting layer formed thereon was secured by a holder in a vacuum deposition apparatus (by Nippon Vacuum Technology K.K.). In a molybdenum boat, 0.5 gram of gold wire was placed. After the vacuum chamber was evacuated to a vacuum of $1 \times 10^{-4}$ Pa, gold was evaporated at a deposition rate of 0.1 nm/sec., forming a counter electrode having a thickness of 50 nm. In this way, the end photoelectric conversion device was completed.

Fabrication of Solar Cell

On the photoelectric conversion device prepared above was rested a platinum-deposited glass member of the same size. There was fabricated a solar cell in which a conductive glass substrate 1 having a conductive layer 2 thereon, a $TiO_2$ electrode 3, a dye layer 4, a hole transporting layer 5, a counter electrode 6, and a platinum-deposited glass member 7 were stacked in the described order as shown in FIG. 1. As seen from FIG. 1, the glass member was shifted relative to the substrate such that the glass member might not overlap the uncovered portion of the photoelectric conversion device.

The above-described procedure was repeated, but the combination of the dye with the organic hole transporting agent was changed as shown in Table 2.

TABLE 2

| No. | Dye | Organic hole transporting agent | Binder Type | Amount (wt %) | Hole transporting layer forming process |
|---|---|---|---|---|---|
| 1 | R-1 | H-1 | — | — | A |
| 2 | R-1 | H-2 | — | — | A |
| 3 | R-1 | H-6 | — | — | A |
| 4 | R-1 | H-10 | — | — | A |
| 5 | R-1 | H-12 | — | — | A |
| 6 | R-1 | H-16 | — | — | A |
| 7 | R-1 | H-18 | — | — | A |
| 8 | R-1 | H-21 | — | — | A |
| 9 | R-2 | H-1 | — | — | A |
| 10 | R-3 | H-3 | — | — | A |
| 11 | R-5 | H-7 | — | — | A |
| 12 | R-7 | H-9 | — | — | A |
| 13 | S-1 | H-11 | — | — | A |
| 14 | S-3 | H-12 | — | — | A |
| 15 | S-7 | H-14 | — | — | A |
| 16 | S-8 | H-15 | — | — | A |
| 17 | S-11 | H-17 | — | — | A |
| 18 | S-13 | H-19 | — | — | A |
| 19 | S-16 | H-22 | — | — | A |
| 20 | S-1B | H-24 | — | — | A |
| 21 | S-19 | H-26 | — | — | A |
| 22 | S-22 | H-28 | — | — | A |
| 23 | S-24 | H-29 | — | — | A |
| 24 | S-23 | H-4 | H-5 | 20 | B |
| 25 | R-1 | H-7 | H-8 | 25 | B |
| 26 | R-1 | H-11 | H-13 | 30 | B |
| 27 | R-1 | H-30 | polyvinyl carbazole | 10 | B |
| 28 | R-1 | H-4 | H-13 | 40 | B |
| 29 | R-1 | H-20 | polycarbonate | 50 | B |
| 30 | R-1 | H-23 | polystyrene | 50 | B |
| 31 | R-1 | H-32 | — | — | A |
| 32 | R-1 | H-33 | — | — | A |
| 33 | R-1 | H-35 | — | — | A |
| 34 | S-7 | H-34 | — | — | A |
| 35 | S-16 | H-36 | — | — | A |

Measurement of Photoelectric Conversion Efficiency

Light of a 500-W xenon lamp (Ushio K.K.) was passed through a AM 1.5 filter (by Oriel Co.) and a sharp cut filter Kenko L-42, obtaining simulated sunlight free of ultraviolet radiation. The intensity of light was 86 mW/cm$^2$.

With clips connected to the conductive glass substrate of the photoelectric conversion device and the platinum-deposited glass member, the simulated sunlight was irradiated to the cell. The electricity generated in the cell was measured by a current-voltage tester (Kessley SMU238). The open circuit voltage (Voc), short circuit current density (Jsc), fill factor (ff), and conversion efficiency (f) of this solar battery were reported in Table 3 along with the short circuit current density after 120 hours of continuous irradiation and a percent drop thereof. Note that the percent drop of short-circuit current density is calculated according to [1—(Jsc after 120 hr.)/(initial Jsc)]×100.

Comparative Example 1

On the dye-sensitized TiO$_2$ electrode substrate (20 mm×20 mm) prepared in Example 2 was rested a platinum-deposited glass member of the same size (see FIG. 1). By utilizing a capillary phenomenon, an electrolytic solution was penetrated into the interface or space between the substrate and the glass member. The electrolytic solution contained 0.05 mol/l of iodine and 0.5 mol/l of lithium iodide in a mixture of acetonitrile and N-methyl-2-oxazolidinone in a volume ratio of 90:10. A comparative solar battery A was fabricated in this way.

Comparative Example 2

A mix solution was prepared by mixing 1 gram of hexaethylene glycol methacrylate (Blenmer PE350 by Nippon Oil & Fats K.K.), 1 gram of ethylene glycol, and 20 mg of 2-hydroxy-2-methyl-1-phenyl-propan-1-one (Darocure 1173 by Nippon Ciba Geigy K.K.) as a polymerization initiator, dissolving 500 mg of lithium iodide in the solution, and deaerating in vacuum for 10 minutes. This mix solution was applied onto the dye-sensitized TiO$_2$ electrode substrate (20 mm×20 mm) prepared in Examples. The porous material having the mix solution coated thereon was placed in vacuum for removing bubbles from the porous material and helping the monomer to penetrate. Thereafter, ultraviolet radiation was irradiated to effect polymerization, thereby distributing a uniform gel of polymer in pores of the porous material. The thus obtained material was exposed to an iodine atmosphere for 30 minutes whereby iodine was diffused into the polymer. A comparative solar battery B was fabricated in this way.

These comparative batteries A and B were tested as in Examples. The results are also shown in Table 3.

TABLE 3

| No. | Jsc (μA/cm$^2$) | Voc (V) | ff | η (%) | Jsc after 120 hr. | Jsc drop (%) |
|---|---|---|---|---|---|---|
| 1 | 1200 | 0.90 | 0.44 | 0.55 | 960 | 20% |
| 2 | 1300 | 0.92 | 0.51 | 0.71 | 1053 | 19% |
| 3 | 1050 | 0.88 | 0.38 | 0.41 | 735 | 30% |
| 4 | 1450 | 0.91 | 0.46 | 0.71 | 1088 | 25% |
| 5 | 1250 | 0.88 | 0.49 | 0.63 | 1013 | 19% |
| 6 | 1140 | 0.85 | 0.43 | 0.48 | 889 | 22% |
| 7 | 1080 | 0.86 | 0.41 | 0.44 | 767 | 29% |
| 8 | 970 | 0.84 | 0.36 | 0.34 | 825 | 15% |
| 9 | 1030 | 0.89 | 0.35 | 0.37 | 855 | 17% |
| 10 | 950 | 0.94 | 0.40 | 0.42 | 703 | 26% |
| 11 | 880 | 0.87 | 0.35 | 0.31 | 686 | 22% |
| 12 | 910 | 0.92 | 0.42 | 0.41 | 746 | 18% |
| 13 | 760 | 0.90 | 0.40 | 0.32 | 638 | 16% |
| 14 | 630 | 0.88 | 0.48 | 0.31 | 536 | 15% |
| 15 | 1200 | 0.84 | 0.41 | 0.48 | 1032 | 14% |
| 16 | 700 | 0.85 | 0.46 | 0.32 | 574 | 18% |
| 17 | 1100 | 0.87 | 0.39 | 0.43 | 847 | 23% |
| 18 | 1020 | 0.85 | 0.41 | 0.41 | 775 | 24% |
| 19 | 1440 | 0.84 | 0.38 | 0.53 | 1066 | 26% |
| 20 | 1100 | 0.95 | 0.37 | 0.45 | 913 | 17% |
| 21 | 910 | 0.89 | 0.35 | 0.33 | 774 | 15% |
| 22 | 920 | 0.68 | 0.41 | 0.30 | 718 | 22% |
| 23 | 790 | 0.86 | 0.45 | 0.36 | 703 | 11% |
| 24 | 1090 | 0.84 | 0.39 | 0.42 | 839 | 23% |
| 25 | 1300 | 0.87 | 0.33 | 0.43 | 936 | 28% |
| 26 | 1020 | 0.89 | 0.35 | 0.37 | 755 | 26% |
| 27 | 1010 | 0.85 | 0.38 | 0.38 | 778 | 23% |
| 28 | 920 | 0.93 | 0.36 | 0.36 | 718 | 22% |
| 29 | 950 | 0.85 | 0.34 | 0.32 | 751 | 21% |
| 30 | 890 | 0.96 | 0.37 | 0.37 | 730 | 18% |
| 31 | 1200 | 0.75 | 0.36 | 0.38 | 924 | 23% |
| 32 | 1430 | 0.80 | 0.41 | 0.55 | 1115 | 22% |
| 33 | 1420 | 0.80 | 0.42 | 0.55 | 1122 | 21% |
| 34 | 1340 | 0.70 | 0.35 | 0.38 | 992 | 26% |
| 35 | 1390 | 0.70 | 0.37 | 0.42 | 1042 | 25% |
| Comparative solar batteryA | 2800 | 0.60 | 0.43 | 0.84 | 252 | 91% |
| Comparative solar batteryB | 2150 | 0.35 | 0.50 | 0.44 | 946 | 56% |

As compared with Comparative Examples, the batteries o: Examples experience little deterioration with time of photoelectric conversion properties.

There has been described a photoelectric conversion device having a layer of dye-sensitized nanoparticulate semiconductor and a hole transporting layer containing an organic hole transporting agent. This photoelectric conversion device eliminates the risk of electrolytic solution leakage and experiences little deterioration with time of properties.

Japanese Patent Application Nos. 257535/1997 and 186935/1998 are incorporated herein by reference.

Reasonable modifications and variations are possible from the foregoing disclosure without departing from either the spirit or scope of the present invention as defined by the claims.

What is claimed is:

1. A photoelectric conversion device comprising:

a nanoparticulate semiconductor layer sensitized with a dye; and a hole transporting layer over the nanoparticulate semiconductor layer containing an aromatic tertiary amine compound as an organic hole transporting agent, wherein said aromatic amine compound is a compound selected from the group consisting of the following compounds of formulae H-1 to H-20 and H-22 to H-30:

H-1
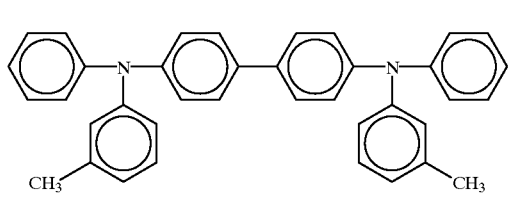

H-2
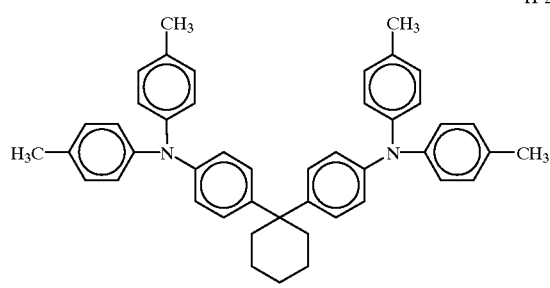

H-3
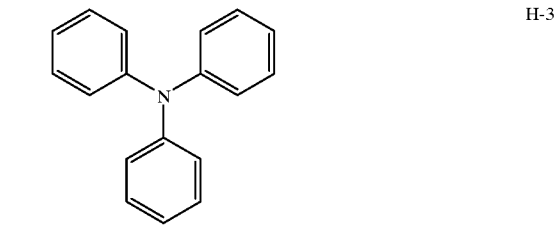

H-4
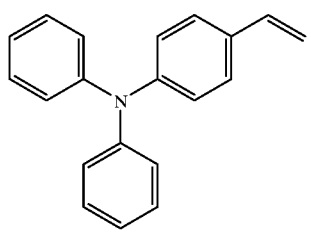

H-5
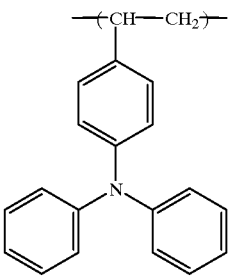

H-6
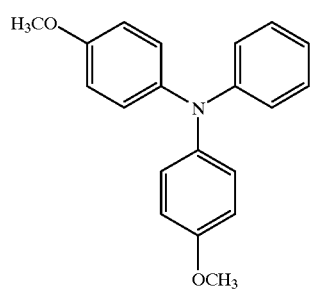

H-7
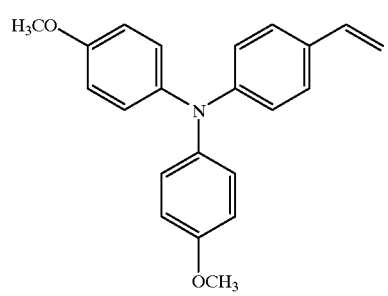

H-8
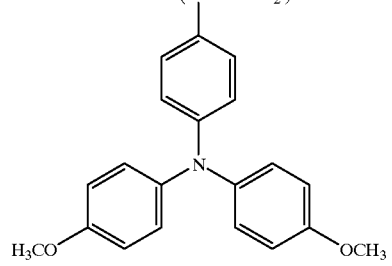

H-9
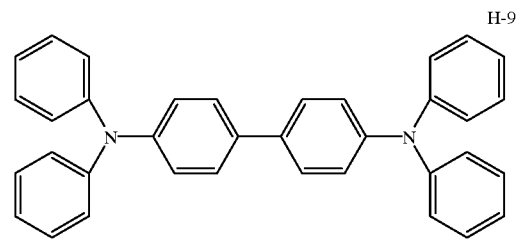

H-10
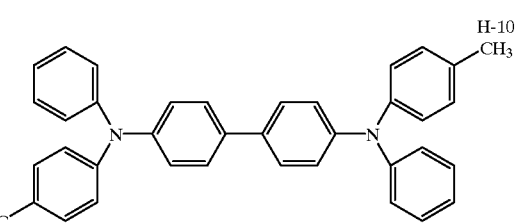

H-11
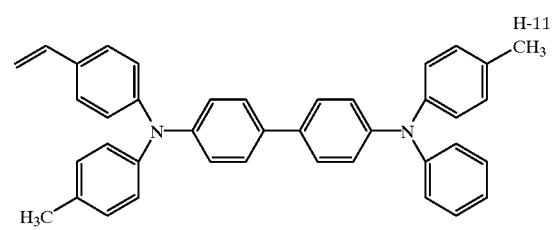
H-12
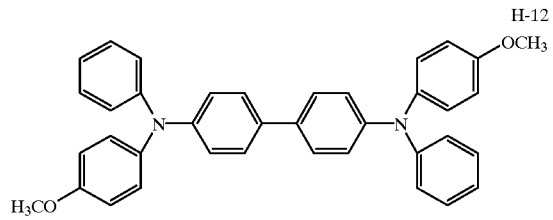
H-13
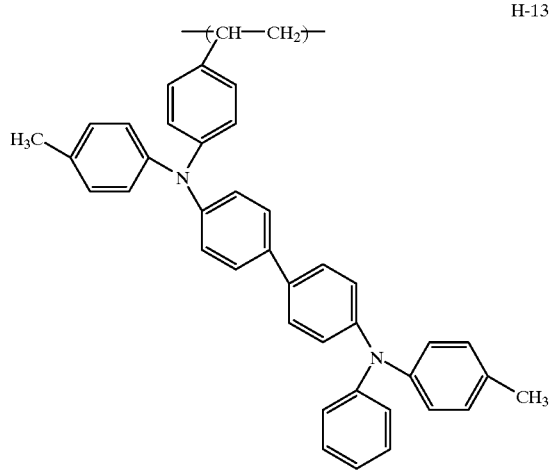
H-14
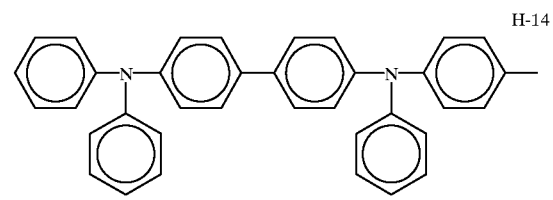
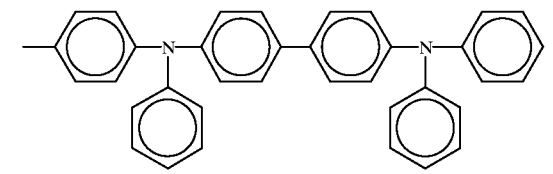
H-15
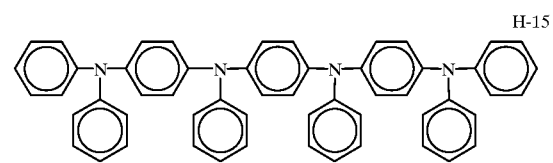
H-16
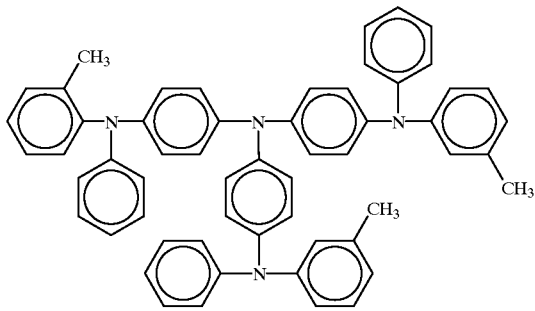
H-17
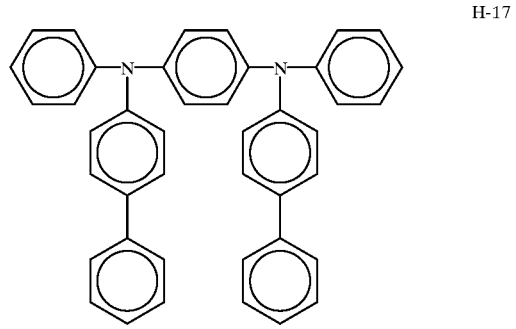
H-18
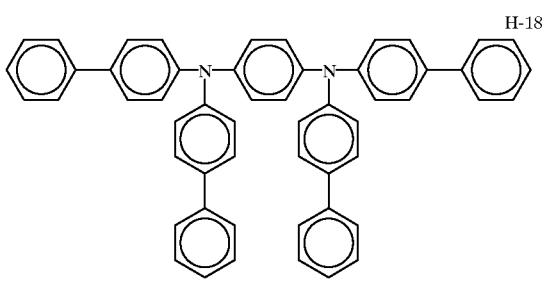
H-19
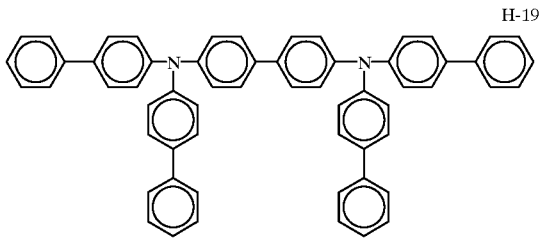
H-20
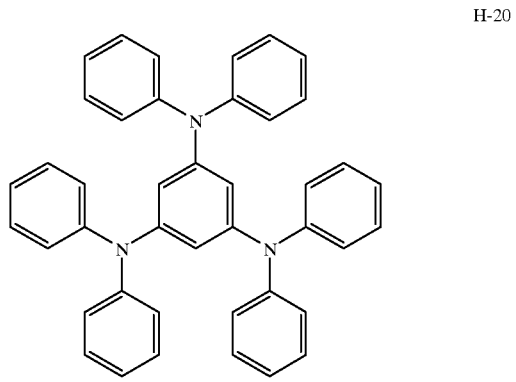

H-22
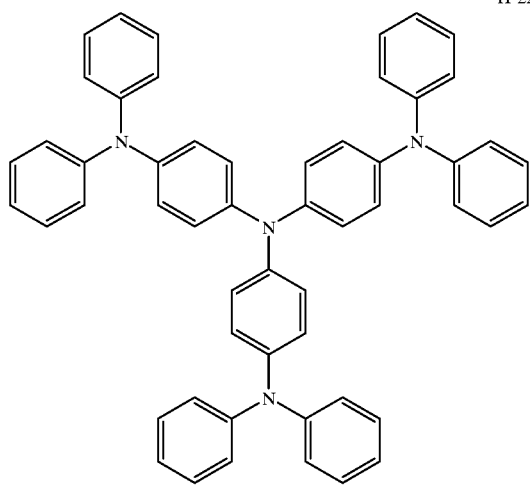
H-23
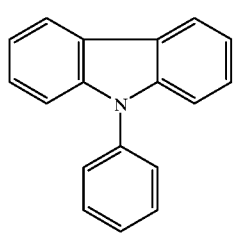
H-24
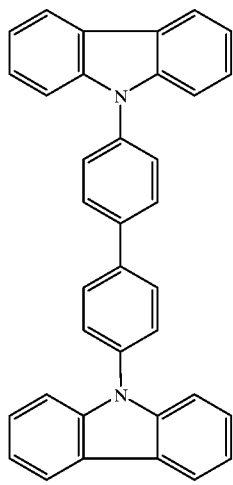
H-25
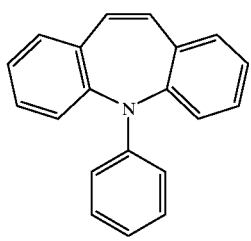
H-26
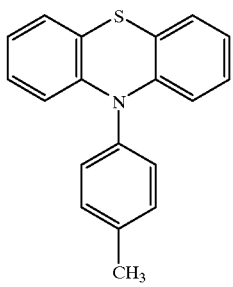
H-27
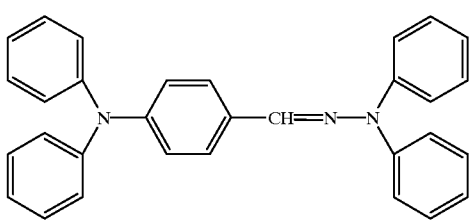
H-28
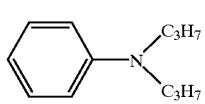
H-29
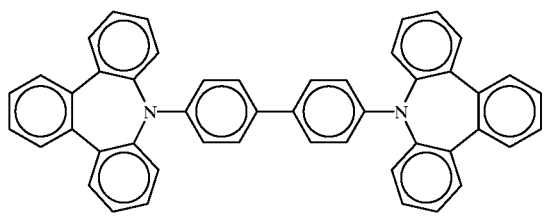
H-30
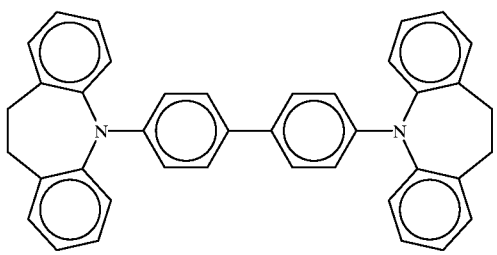
2. The photoelectric conversion device of claim 1 wherein said aromatic tertiary amine compound has a molecular weight of at least 1,000.
3. The photoelectric conversion device of claim 1, wherein said aromatic amine compound is:

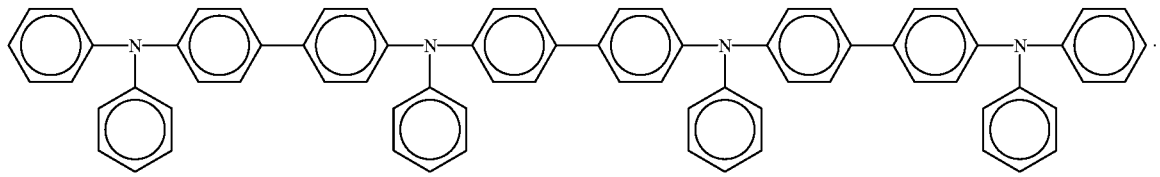

4. The photoelectric conversion device of claim 1, wherein said aromatic amine compound is:

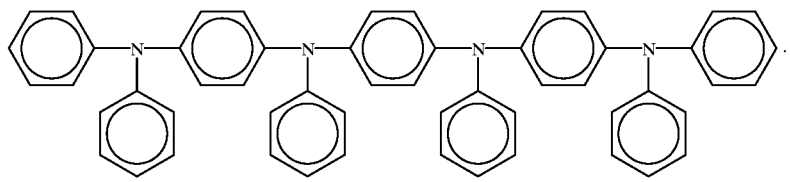

5. The photoelectric conversion device of claim 1, wherein said aromatic amine compound is:

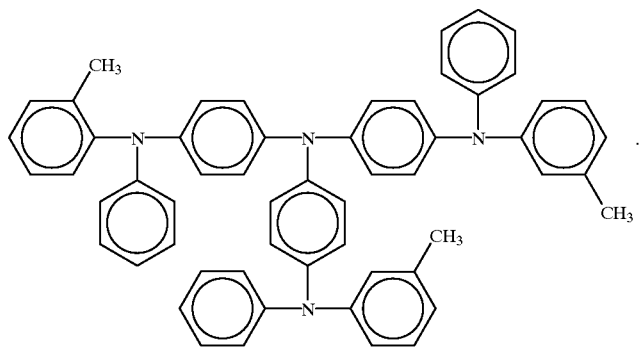

6. A solar cell comprising the photoelectric conversion device of claim 1.

7. A photoelectric conversion device comprising:

a nanoparticulate semiconductor layer sensitized with a dye; and a hole transporting layer over the nanoparticulate semiconductor layer containing an aromatic tertiary amine compound as an organic hole transporting agent, wherein said aromatic amine compound is a compound selected from the group consisting of the following compounds of formulae H-21 and H-31 to H-39:

H-21
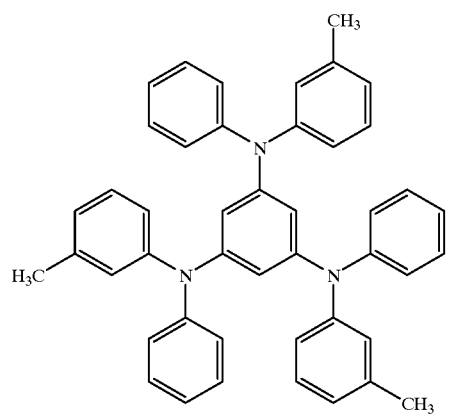
H-31
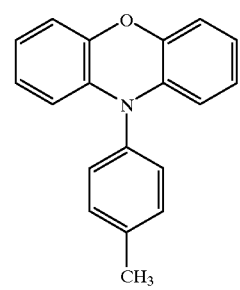
H-32
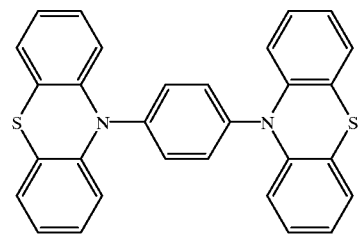
H-33
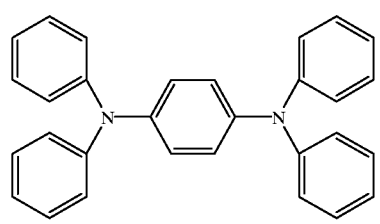
H-34
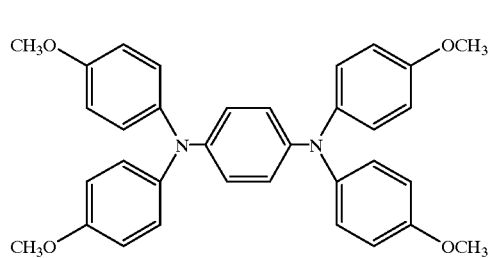
H-35
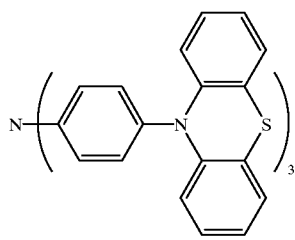
H-36
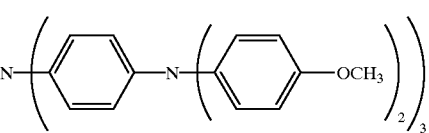
H-37
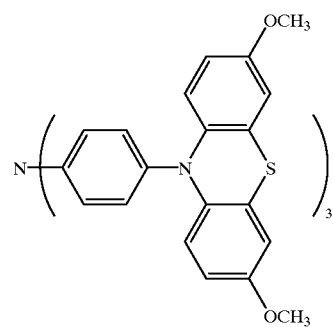
H-38
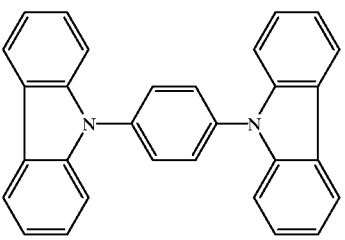
H-39
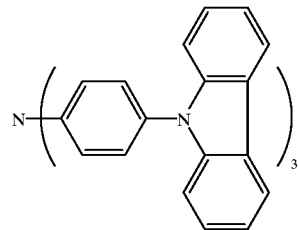
8. The photoelectric conversion device of claim 7, wherein said aromatic tertiary amine compound has a molecular weight of at least 1,000.
9. A solar cell comprising the photoelectric conversion device of claim 7.
* * * * *

UNITED STATES PATENT AND TRADEMARK OFFICE
CERTIFICATE OF CORRECTION

PATENT NO. : 6,084,176
DATED : July 4, 2000
INVENTOR(S) : K. SHIRATSUCHI, et al.

It is certified that error appears in the above-identified patent and that said Letters Patent is hereby corrected as shown below:

On page one, section [73], address of Assignee is changed from "Minami-Ashigara, Japan" to --Kanagawa, Japan--

Signed and Sealed this

Eighth Day of May, 2001

Attest:

NICHOLAS P. GODICI

*Attesting Officer*     *Acting Director of the United States Patent and Trademark Office*